United States Patent [19]

Shoji

[11] 4,290,026
[45] Sep. 15, 1981

[54] POWER AMPLIFIER WHOSE BIAS VOLTAGE CHANGES DEPENDING ON POWER SUPPLY VOLTAGE

[75] Inventor: Masashi Shoji, Tokyo, Japan

[73] Assignee: Nippon Electric Co., Ltd., Tokyo, Japan

[21] Appl. No.: 60,315

[22] Filed: Jul. 25, 1979

[30] Foreign Application Priority Data

Jul. 25, 1978 [JP] Japan ................................. 53/91093

[51] Int. Cl.³ .............................................. H03F 3/45
[52] U.S. Cl. ..................................... 330/255; 330/261
[58] Field of Search ......................... 330/255, 261, 296

[56] References Cited

U.S. PATENT DOCUMENTS 3,843,935 10/1974 Seki ................................. 330/255 X
3,898,576 8/1975 Fukaya ........................... 330/255 X Primary Examiner—James B. Mullins
Attorney, Agent, or Firm—Sughrue, Mion, Zinn, Macpeak & Seas

[57] ABSTRACT

A power amplifier whose bias voltage changes depending on the power supply voltage comprises a first amplifier with an input terminal and a feedback terminal. A second amplifier amplifies the output of the first amplifier, and the output of the second amplifier is fed back to the feedback terminal of the first amplifier. A bias circuit is connected between the power supply terminals and provides a bias to the input terminal of the first amplifier. The bias circuit includes a series connection of a first constant voltage generating device, a first resistor, a second resistor, and a parallel connection of a second constant voltage generating device and a third resistor. The input terminal of the first amplifier is biased by a voltage depending on the voltage at a connection point between the first and second resistors.

12 Claims, 4 Drawing Figures

FIG.1 — PRIOR ART
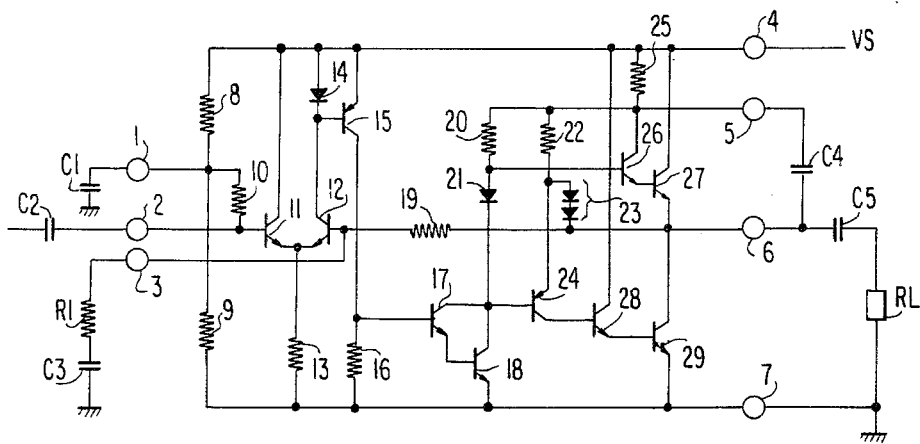
FIG.2
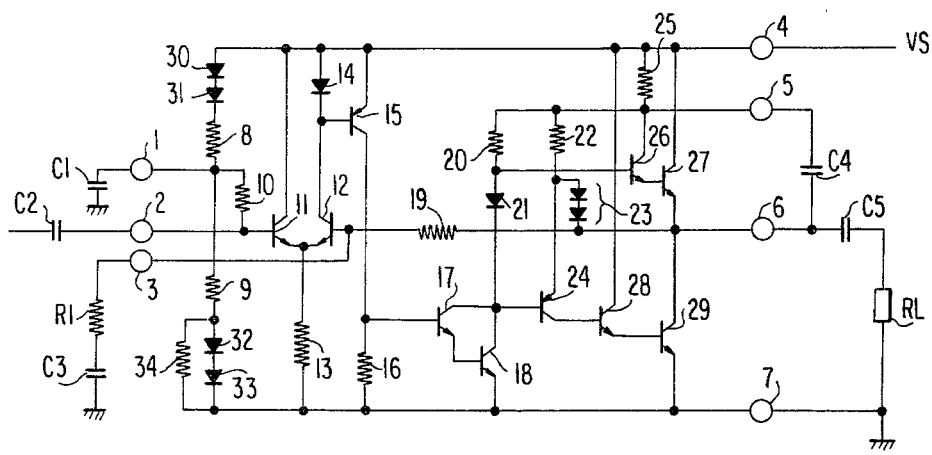

POWER AMPLIFIER WHOSE BIAS VOLTAGE CHANGES DEPENDING ON POWER SUPPLY VOLTAGE

BACKGROUND OF THE INVENTION

The present invention relates to a power amplifier and, more particularly, to a power amplifier equipped with a differential amplifier input stage and a single-ended push-pull output stage.

In conventional power amplifiers, the input signal is received on the input stage and is voltage-amplified on the driver stage. It is then power-amplified on the output stage of a single-ended push-pull type to supply the power to the load. In these power amplifiers, the output is normally fed back to the input stage to form a negative feedback. In many instances, a differential amplifier is used as the input stage to increase the input impedance. A bias voltage is applied to a non-inverting input terminal of the differential amplifier in the input stage by resistance dividing of the power supply voltage. An input signal is also applied to the non-inverting input terminal. Appropriately attenuated output from the output stage is applied to the inverting input terminal as a negative feedback signal. In such a circuit configuration, the output mid-point potential is almost equal to the input bias voltage. For this reason, an input bias voltage is normally set at a voltage about half that of a power supply voltage.

When operating this power amplifier with a sufficiently large power supply voltage, the voltage at the output point of the output stage can swing to the full power supply voltage, thus deriving a large output with less distortion and increasing the utilization efficiency of the power supply. When the power supply voltage is low, deficiencies, such as noted below, result. The output stage is constructed by a series connected PNP and NPN transistors. When they are built in a semiconductor integrated circuit, it is necessary to form the output stage by a compound PNP and NPN transistor which combines two or more transistors and makes them an equivalent transistor. For this reason, the threshold voltages (the input voltages to start current flowing) of the compound PNP and NPN transistors differ, resulting in a deficiency that the output signal distorts at one half of the cycle in spite of no distortion at the other half when the power supply voltage becomes low. Thus, if the power supply voltage becomes low, the non-distorted output becomes still smaller in amplitude. This deficiency deteriorates the utilization efficiency of the power supply voltage. This deficiency is more conspicuous when a bootstrap is applied to improve the drive efficiency of the output stage.

SUMMARY OF THE INVENTION

The major object of the present invention is to provide a power amplifier, with which a nondistorted output can be obtained over a wide range of power supply voltage. This offers a high utilization efficiency of the power supply voltage, and is particularly suitable in constituting an amplifier operated by batteries as a power supply.

According to the present invention, a power amplifier comprises a first amplifier with an input terminal and a feedback terminal, a second amplifier to amplify the output of the first amplifier, means for feeding back the output of the second amplifier to the feedback terminal of the first amplifier, an input means coupled to the input terminal of the first amplifier for receiving an input signal, an output means for deriving the output of the second amplifier, and a bias circuit to bias the input terminal of the first amplifier, the bias circuit being connected between the two terminations of a power-supply voltage applying terminal, and including a series connection of a first constant voltage generating means, a first resistor, a second resistor, and a parallel connection of a second constant voltage generating means and a third resistor, and the input terminal of the first amplifier being biased by a voltage depending on the voltage at a connection point between the first and second resistors of the bias circuit.

By the present invention, in the case of a sufficiently high power supply voltage, the bias voltage obtained from the bias circuit is determined by the first and second constant voltage generating means and the resistance ratio of the first and second resistors irrespective of the third resistor. Consequently, a bias voltage which is mainly determined by the resistance ratio of the first and second resistors and one half of the power supply voltage, for example, can be derived at the connection point between them in this voltage range. When the power supply voltage decreases and the second constant voltage generating means no longer operates fully, the third resistor becomes more dominant in place of the second resistor and the second constant voltage generating means in determining the bias voltage. In such a voltage range, a bias voltage determined by a ratio between the resistance value of the first resistor and the sum of resistances of the second and third resistors is derived at the connection point of the first and second resistors. For this reason, an appropriate bias voltage can be obtained according to a change of the power supply voltage. This permits distortionless output over a wide power supply voltage range and a high utilization efficiency of the power supply over a wide power-supply voltage range. These advantages suit power amplifiers driven by batteries whose power supply voltage easily vary.

BRIEF DESCRIPTION OF THE DRAWINGS

The above and other objects, features and advantages of the present invention will become more apparent from the following detailed description in conjunction with the accompanying drawings, wherein:

FIG. 1 is a circuit diagram of a conventional power amplifier;

FIG. 2 shows a circuit diagram of a power amplifier in a first preferred embodiment of the present invention;

DESCRIPTION OF THE PRIOR ART

Figure 3:
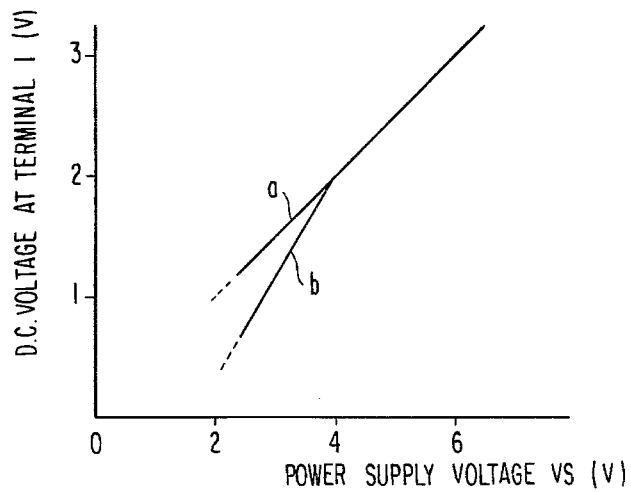
FIG. 3 is a graph which shows the variation of an input bias voltage relative variation of the power supply voltage.

In a conventional power amplifier shown in FIG. 1, a differential amplifier consists of transistors 11 and 12 and a resistor 13. The voltage Vs applied between a ground terminal 7 and the power supply terminal 4 is voltage divided by resistors 8 and 9. The alternating current components superposed on the D.C. voltage at the connection point between resistors 8 and 9 are by-passed to a capacitor C1 through a terminal 1, and the D.C. voltage is applied as a bias voltage to the base of the transistor 11 through a resistor 10. The input signal is applied to the base of the transistor 11 through a capacitor C2 and input terminal 2. The output of the differential amplifier appears across a diode D14, which is the load of the transistor 12. It is applied to a transistor 15 for phase inversion. The phase inverted signal appearing across its load resistor 16 is applied to a single-ended push-pull circuit consisting of a Darlington-connected NPN transistor configuration 26-27 and a complementary-connected PNP transistor configuration 24-28-29 through drive transistors 17 and 18. It is then output at output terminal 6. The common collectors of the drive transistors 17 and 18 which are Darlington-connected are connected to the power supply terminal 4 through a diode 21 and resistors 20 and 25. Terminals equivalent to the bases of the compound transistor configurations 26-27 and 24-28-29 connect to both ends of the diode 21. The emitter of the transistor 27 and the collector of the transistor 29 are connected in common to an output terminal 6. The emitter of transistor 24 is connected to the connection points of the resistors 20 and 25 through a resistor 22 and to the output terminal 6 through diodes 23. The collector of the transistor 26 is connected to the connection point of the resistors 20 and 25 and is connected to a bootstrap terminal 5 together with the resistor 22. The base of transistor 12 is connected to the output terminal 6 through a resistor 19 and is grounded through feedback terminal 3, resistor R1 and capacitor C3. The output terminal 6 is grounded through a capacitor C5 and a load $R_L$ and connects the bootstrap terminal 5 through a capacitor C4.

The input signal applied to the input terminal 2 is applied to the drive transistors 17 and 18 through the phase inversion transistor 15 after being amplified by the differential amplifier comprising transistors 11 and 12. The input signal is then amplified by the drive transistors 17 and 18 and is provided at output terminal 6 through the single-ended push-pull circuit of transistors 24 and 26 to 29 to load $R_L$ through capacitor C5. Due to the feedback circuit of resistors 19 and R1 and capacitor C3, the D.C. voltage of the output terminal 6, that is, the output voltage when no input signal is received, becomes almost equal to the D.C. voltage of the bias terminal 1 connected to the connection point of the resistors 8 and 9, that is, the bias voltage. In more detail, when the output voltage is higher than the bias voltage, the transistor 12 conducts causing transistor 15 and drive transistors 17 and 18 to conduct which in turn cause the lower compound transistor configuration 24-28-29 to conduct and to lower the output voltage. When the output voltage is lower than the bias voltage, the transistor 11 conducts to make the transistor 15 and drive transistors 17 and 18 cut-off. Consequently, the upper compound transistor configuration 26-27 conducts and the output voltage increases. Thus, the circuit operates so that the output voltage and bias voltage will become nearly equal. It is necessary for obtaining a large distortion-free output to set resistors 8 and 9 so that the output D.C. voltage will be half of the power supply voltage. For this reason, the resistances of the resistors 8 and 9 are set to an equal value.

The output stage comprises a Darlington-connected PNP transistor comprising the transistors 26 and 27 and a complementary-connected NPN transistor comprising the transistors 24, 28 and 29 to increase the current amplification factor $h_{FE}$ and to supply a large power to the load $R_L$. The D.C. voltage at the bootstrap terminal 5 is lower than the power supply voltage Vs by the voltage drop of resistor 25, and changes by the same amplitude as that of the output signal of the output terminal 6 when an input signal is applied. Capacitor C4 supplies a drive current to transistor 26 through the resistor 20 when the upper compound transistor configuration 26-27 is conducting. The capacitor C4 is then charged by the power supply voltage Vs through the resistor 25 when the lower compound transistor configuration 24-28-29 is conducting. In such a power amplifier, the output D.C. voltage is always one half of the power supply voltage, and the relation between the output D.C. voltage and the power supply voltage can be shown in FIG. 3 by a straight line a whose slope becomes 1. When a low power supply voltage is supplied (a voltage around 2.5~3.5 V), the voltage between the power supply terminal 4 and output terminal 6 becomes small, and the upper compound transistors 26-27 becomes easily non-conductive. The collector-emitter voltage to cause the compound transistors 26 and 27 to conduct is the sum of the forward voltages between the bases and emitters of the transistors 26 and 27 (about twice of 0.7 V) and the voltage drops of the resistors 20 and 25. This voltage is about 3.5 V, or above. The compound transistor configuration 26-27 stays non-conductive below that voltage level, and when an input signal is applied, the output at the output terminal 6 will easily distort on half cycles only, thus causing the listener discomfort. To use such a power amplifier in the amplifier system of a radio, tape recorder, etc. which uses batteries as a power supply will constitute a deficiency when the power voltages of the batteries decreases.

DESCRIPTION OF THE PREFERRED EMBODIMENTS OF THE INVENTION

The first embodiment of the present invention will be explained in more detail by referring to FIG. 2. The sections which are the same as those in the conventional power amplifier (FIG. 1) are given the same references. The only differences are the bias circuit connected between the power supply terminal 4 and the grounding terminal 7. The bias circuit has a series connection of forward-biased diodes 30 and 31 (at least one, two in this case), resistors 8 and 9, and forward-bised diodes 32 and 33 (at least one, two in this case). Additional resistor 34 is connected between both terminals of the diodes 32 and 33, and the connecting point of the resistors 8 and 9 connects to the base of transistor 11 through the resistor 10 and to bias terminal 1.

When a voltage of 6~9 V is used as the power supply voltage Vs, resistors and capacitors with the following values are used:

| Capacitor | | | | Resistor | | |
|---|---|---|---|---|---|---|
| | C1 | 22 | μF | | R1 | 200 Ω |
| | C2 | 3.3 | μF | | 8 | 10 KΩ |
| | C3 | 22 | μF | | 9 | 10 KΩ |
| | C4 | 47 | μF | | 34 | 20 KΩ |
| | C5 | 470 | μF | | 10 | 20 KΩ |
| | | | | | 13 | 10 KΩ |
| | | | | | 16 | 30 KΩ |
| | | | | | 19 | 20 KΩ |
| | | | | | 20 | 3 KΩ |
| | | | | | 22 | 3 KΩ |
| | | | | | 25 | 200 Ω |

The bias circuit voltage-divides the power-supply voltage, and outputs a bias voltage at bias terminal 1. The direct current voltage of the bias terminal 1, that is, the bias voltage V1, is determined by the resistors 8 and 9 when the power supply voltage Vs is above the specified voltage. It becomes one half the power supply voltage Vs by setting the resistors 8 and 9 at an equal value. This change of the bias voltage is similar to the upper part of the straight line a in FIG. 3. When the power supply voltage becomes below the specified voltage, the bias voltage is obtained by dividing by the resistors 8, 9 and 34 the voltage deducted from the power supply voltage Vs by the forward voltage of the diodes 30 and 31. By appropriately setting the resistance values of the resistors 8, 9 and 34, the voltage will be lower than half of the power supply voltage Vs. FIG. 3 also shows the relation between the above bias voltage V1 and power supply voltage Vs by line b. In a power-supply voltage Vs range above a specified voltage (about 4 V), the variation proportion of the bias voltage V1, that is, the slope of the line a, will be 1 relative to the variation of the power supply voltage Vs. In the voltage Vs range below a specified voltage, the variation proportion of the bias voltage V1, that is, the slope of the line b, will be larger than 1 relative to the variation of the power supply voltage Vs. The slope of the line b is determined by the ratio of the sum of the resistance values of resistors 9 and 34 and the resistance value of resistor 8. The point where the straight line b crosses the straight line a, that is, the specified voltage, is also determined. The straight line b in the range of the power-supply voltage Vs below the specified voltage can move horizontally on the axis of the abscissa by a change in the number of the diodes 30, 31, 32 and 33 connected in series. It moves about 0.7 horizontally to the left side on the axis of the abscissa when there are diodes 30 and 33 only (diodes 31 and 32 are deleted). It moves to the right when the number of diodes is increased. The decreasing rate of the bias voltage V1 will be large at a voltage below the specified voltage when the resistance value of the resistor 34 is lowered. When the resistance value of the resistor 34 is increased, the decreasing rate of the bias voltage will be less. The variable range of the resistance value of the resistor 34 is determined by resistances of resistors 8 and 9, and it can be changed within the range of $10\sim30$ k$\Omega$ in this embodiment. Such a relationship between the power supply voltage Vs and bias voltage V1 can be considered as a relationship between the power supply voltage Vs and output D.C. voltage Vo of the output terminal 6. When the voltage is below a specified voltage (about $2.5\sim3.5$ V), the upper compound transistor configuration 26–27 can be driven by making the output D.C. voltage Vo lower than half of the power supply voltage Vs and by making the voltage difference between the output D.C. voltage Vo and the power supply voltage Vs.

For this reason, when the power supply voltage Vs is below a specified voltage, the compound transistor configurations 26–27 and 24–28–29 operate reversely to each other in response to a small input signal, and derive at the output terminal 6 an output signal which is vertically symmetrical and distortion-free. When applying a large input signal, an upper part of the output signal having an amplitude equal to the amplitude of the lower part of it can be obtained by appropriately setting the values of resistor 25 and capacitor C4 constituting the bootstrap circuit for supplying a drive current to transistor 26. When the power supply voltage Vs is above a specified voltage, the output D.C. voltage Vo will be half of the power supply voltage, but the normal operation of the output stage can be maintained due to high power supply voltage. Maximum output signal amplitude is nearly equal to one half of the power supply voltage and is vertically symmetrical.

Figure 4:
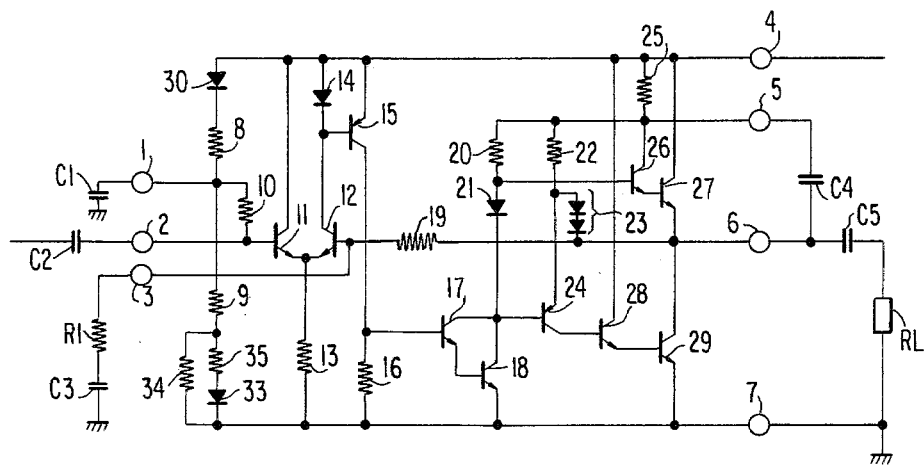
FIG. 4 is a circuit diagram of a power amplifier in another preferred embodiment of the present invention.

Another embodiment of the present invention will be explained by referring to FIG. 4. Those sections that are the same as those in FIG. 2 also have the same references. The difference is in the bias circuit connected between the power supply voltage applying terminal 4 and the grounding terminal 7. The bias circuit has a diode 30, resistors 8, 9 and 35, and a diode 33. The connection point between resistors 9 and 35 is bypassed to the grounding terminal 7 through resistor 34. The resistance value of resistor 8 is set equal to the sum of the resistance value of resistors 9 and 35. In a power amplifier of this embodiment, the bias voltage V1 obtained at the connection point between resistors 8 and 9 is mainly determined by the ratio between the resistors 8 and 9, when the power supply voltage is above the specific voltage. The bias voltage V1 is determined by the resistance ratio among the resistors 8 and the resistors 9 and 34 when the voltage is below the specified voltage. It can be shown as the upper part of line a and the line b in FIG. 3. This is similar to the case with the voltage of the bias voltage V1 of the above-mentioned embodiment shown in FIG. 2, indicating that the same effects can be derived. An operation such as this can also be obtained by equalizing the resistance values of resistors 8 and 9 and omitting resistor 35.

As stated, a power amplifier according to the present invention offers an output amplitude effectively utilizing the power supply voltage in a wide power-supply voltage range. Upper and lower compound transistor configurations in the output stage operate reversely to each other to obtain vertically symmetrical output signals in response to input signals up to a low power supply voltage.

Power amplifiers in the present invention will be extremely effective when used in amplifier systems to which power is supplied from batteries. This is because the power amplifier is operable down to a low power supply voltage range. The power voltage obtained from batteries gradually decreases according to the operating time of the amplifier. However, the amplifier of this invention achieves distortionless maximum output having an amplitude nearly equal to one half of the power supply voltage range, even if the power supply voltage is lowered.

It is apparent to the skilled that the present invention is not limited to the above embodiments and can be subjected to further modifications. It can be used, for instance, in determining the output D.C. voltage by biasing an inverting input terminal of the differential amplifier by the output of the bias circuit of the present invention.

What is claimed is:

1. A power amplifier comprising a differential amplifier having a first input terminal receiving an input signal and a second input terminal, a bias circuit connected between first and second power supply terminals and having a bias terminal coupled to said first input terminal, a drive stage receiving the output from said differential amplifier, a single-ended push-pull output stage driven by said drive stage, an output terminal coupled to said single-ended push-pull output stage, a feedback circuit coupled between said output terminal and said second input terminal, said single-ended push-pull output stage having a first compound transistor coupled between said first power supply terminal and said output terminal and a second compound transistor coupled between said output terminal and said second power supply terminal, said first compound transistor being activated by a voltage applied between said first power supply terminal and said output terminal, said second compound transistor being activated by a second voltage applied between said output terminal and said second power supply terminal, said first voltage being larger than said second voltage, said bias circuit including a first series connection of a first constant voltage generating means and a first resistor inserted between said first power supply terminal and said bias terminal and a second series connection of a second constant voltage generating means and a second resistor inserted between a said bias terminal and said second power supply terminal, and a third resistor connected in parallel to said second constant voltage generating means.

2. A power amplifier claimed in claim 1, wherein said first compound transistor comprises two transistors of the same conductivity type connected in Darlington-connection and said second compound transistor comprises three transistors of plural conductivity types connected to form an equivalent single transistor.

3. A power amplifier claimed in claim 1, wherein said single-ended push-pull output stage further has a bootstrap circuit.

4. A power amplifier claimed in claim 3, wherein said bootstrap circuit includes a fourth resistor, a fifth resistor and a capacitor charged by the voltage at said first power supply terminal through said fourth resistor and supplying a base current to the base of said first compound transistor through said fifth resistor.

5. A power amplifier claimed in claim 1, wherein said first and second resistors have an equal resistance value and said first and second constant voltage generating means have the same number of forward-biased diodes.

6. A power amplifier claimed in claim 1, wherein said first and said second resistor have an equal resistance value and said first and said second constant voltage generating means generate an equal constant voltage.

7. A power amplifier claimed in claim 1 or 4, wherein each of said first and second constant voltage generating means comprises at least one forward-biased diode.

8. A power amplifier claimed in claim 1, wherein said first constant voltage generating means is a first forward-biased diode, and said second constant voltage generating means is a series connection of a resistor and a second forward-biased diode.

9. A power amplifier comprising first and second power supply terminals, a bias circuit connected between said first and second power supply terminals and having a bias potential terminal, a first amplifier having an input terminal coupled to said bias potential terminal and a feedback terminal, said input terminal receiving an input signal, a second amplifier receiving an output of said first amplifier and having an output terminal, and a feedback means coupled between said output terminal and said feedback terminal, said second amplifier including a first amplification portion coupled between said first power supply terminal and said output terminal and energized by one half cycle of the output of said first amplifier and a second amplification portion coupled between said second power supply terminal and said output terminal and energized by the other half cycle of said output, a voltage necessary to activate said first amplification portion being larger than that necessary to activate said second amplification portion, and said bias circuit including a first constant voltage generating means and a first resistor connected in series between said first power supply terminal and said bias potential terminal, a second constant voltage generating means and a second resistor connected in series between said bias potential terminal and said second power supply terminal and a third resistor connected in parallel to said second constant voltage generating means.

10. A power amplifier claimed in claim 9, wherein said first amplifier is a differential amplifier.

11. A power amplifier claimed in claim 9 or 6, wherein each of said first and second voltage generating means comprises a plurality of forward-biased diodes.

12. A power amplifier claimed in claim 9, wherein said first constant voltage generating means is a first forward-biased diode and said second constant voltage generating means is a resistor and a second forward-biased diode connected in series with each other.

* * * * *